United States Patent
Zele et al.

[11] Patent Number: 6,055,421
[45] Date of Patent: Apr. 25, 2000

[54] CARRIER SQUELCH METHOD AND APPARATUS

[75] Inventors: Rajesh H. Zele, Austin, Tex.; Joseph J. Medvid, III, Ft. Lauderdale; Branko Avanic, Miami, both of Fla.; Richard Brown Meador, Gilbert, Ariz.

[73] Assignee: Motorola, Inc., Schaumburg, Ill.

[21] Appl. No.: 08/961,899

[22] Filed: Oct. 31, 1997

[51] Int. Cl.[7] .................................................. H04Q 7/14
[52] U.S. Cl. ....................... 455/218; 455/212; 455/219; 455/222; 455/223
[58] Field of Search ................................... 455/212, 218, 455/221, 229, 219, 220, 222, 223, 224, 225

[56] References Cited

U.S. PATENT DOCUMENTS

| | | |
|---|---|---|
| 4,455,664 | 6/1984 | Burke ........................................ 455/218 |
| 4,724,545 | 2/1988 | Hamada . | |
| 4,731,873 | 3/1988 | Voyce ........................................ 455/218 |
| 5,151,922 | 9/1992 | Weiss . | |
| 5,199,109 | 3/1993 | Baker . | |
| 5,287,549 | 2/1994 | Roehrs et al. ........................ 455/218 X |
| 5,450,622 | 9/1995 | Vandegraaf . | |
| 5,526,530 | 6/1996 | Sueoka et al. ........................... 455/218 |
| 5,649,321 | 7/1997 | Kellenberger ........................... 455/221 |
| 5,844,938 | 12/1998 | Hupp et al. ......................... 455/212 X |

*Primary Examiner*—Wellington Chin
*Assistant Examiner*—Yemane Woldetatios
*Attorney, Agent, or Firm*—Andrew S. Fuller

[57] ABSTRACT

A radio receiver operates primarily in a first operating mode to process received signals (410). When a carrier signal detect is triggered while in the first operating mode (415, 420), the receiver temporarily operates in a second operating mode which has receiver parameters selected to reduce carrier detect falsing when compared to the first operating mode (430). Preferably, in the second operating mode, the receiver's frequency and time response characteristics are modified to facilitate carrier squelch detection. Carrier squelch is performed if a carrier signal detect is triggered while the receiver operates in the second operating mode (440, 450, 460, 470).

15 Claims, 4 Drawing Sheets

CARRIER SQUELCH METHOD AND APPARATUS

TECHNICAL FIELD

This invention relates in general to squelch circuits in radio receivers, and more particularly, to the detection of carrier signals for squelch purposes.

BACKGROUND OF THE INVENTION

Radio receivers often include squelch circuitry for preventing output of a received signal having an unacceptable level of noise. A typical squelch circuit may be operated by signal energy in the receiver passband, by noise quieting, or by other techniques. The prior art also describes carrier squelch techniques, in which an audio output is enabled when a carrier signal is detected having an acceptable signal to noise ratio.

A radio receiver generally includes a front-end portion, immediately following the antenna, that operates across a frequency band to process signals associated with a carrier frequency on a particular channel. The frequency band is sufficiently wide to allow for variation of the carrier frequency within a particular range. This ensures that a carrier signal can be detected within certain operating tolerances of the transmitter, the receiver, and the communication environment. A wide frequency band, however, permit other signals to potentially affect the detection of a carrier signal within the frequency band. For example, signals from adjacent channels may be present in the frequency band and thus trigger a carrier squelch detect signal.

Squelch circuit designs may include protection against falsing. Falsing occurs when a carrier squelch detect is triggered by a signal from an interferer or from an adjacent channel that appears to be an on-channel carrier signal. Hysteresis and multiple sampling techniques have been used in the prior art to protect against falsing. It is also common to use a narrow bandpass filter in the radio front end circuitry eliminate all but those frequencies close to the desired carrier frequency. Such filters and additional processing components add to the cost and complexity of prior art receivers.

Direct conversion receivers are known in the art to offer significant advantages in terms of cost and complexity in radio designs. However, direct conversion receivers have reduced protection from frequencies outside the area of interest. Hence, extra protection against falsing must be included for squelch circuits that operate in conjunction with such receivers. Narrow bandpass filters commonly used in heterodyne type receivers are not suitable for direct conversion receivers. Preferably, falsing protection should be provided without using additional components which could increase radio design cost and complexity. Any solution should provide a timely response to a valid carrier signal present within the channel of operation of the radio, while reducing the effects of spurious signals. Therefore, a new approach to carrier squelch detection is needed.

DETAILED DESCRIPTION OF THE PREFERRED EMBODIMENT

The present invention provides for improved carrier squelch detection in a radio, and is particularly suitable when the radio has a direct conversion receiver. The radio receiver is selectively operable in a normal operating mode for processing received signals, and a carrier squelch adapt mode for enhanced detection of carrier signal. A carrier detect signal is triggered while the radio receiver is processing a received signal in a normal operating mode. The radio receiver is then temporarily operated in the carrier squelch adapt mode, by programming the receiver with parameters selected to reduce carrier detect falsing, and by monitoring to detect a carrier signal while in the carrier squelch adapt mode. When a carrier detect signal is triggered while the receiver is in the carrier squelch adapt mode, carrier squelch is initiated, such as by enabling an output device coupled to the received signal.

Figure 1:
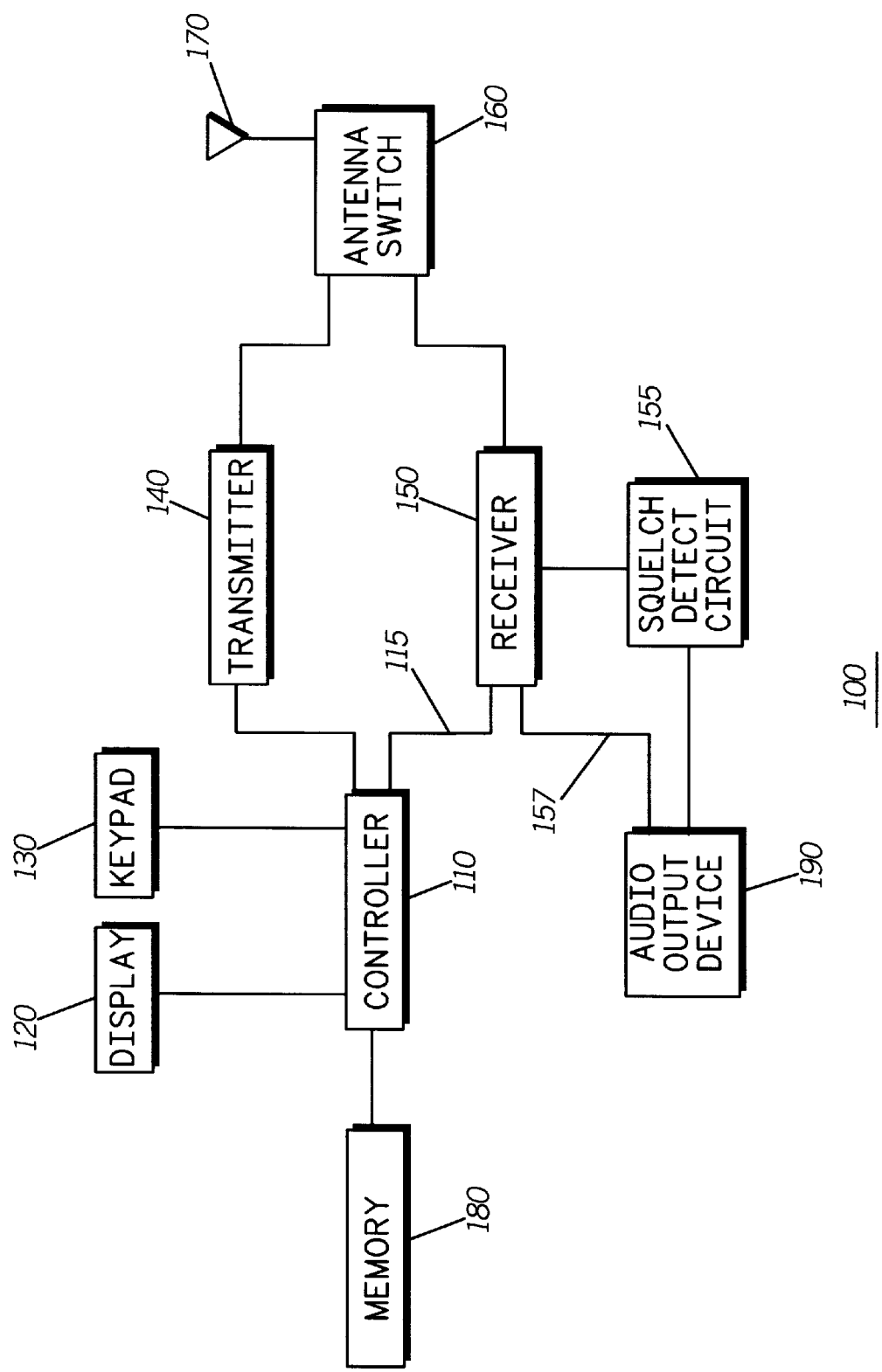
FIG. 1 is a block diagram of a radio, in accordance with the present invention.

FIG. 1 is a block diagram of a communication device 100, in accordance with the present invention. The communication device 100 is preferably a two-way radio or radio telephone that is operable to provide telephone interconnect, dispatch, and private call services. In the radio 100, a controller 110 is coupled to a memory 180, to a transmitter 140, and to a receiver 150, to provide communication circuitry. The transmitter 140 and the receiver 150 are coupled via an antenna switch 160 to an antenna 170. For transmit operations, the controller 110 configures the antenna switch to couple the transmitter 140 to the antenna 170. Similarly, for receive operations, the controller 110 operates the receiver, via a control signal 115, and couples the antenna 170 via the antenna switch 160 to the receiver 150. Receive and transmit operations are conducted under instructions stored in the memory 180. A display 120 and keypad 130 are coupled to the controller 110 and provide a user interface for accessing radio functions. An audio output device 190, such as a speaker, renders audio output from a received signal 157 process by the receiver 150. In accordance with the present invention, the radio 100 includes a squelch detect circuit 155, also referred to herein as a carrier signal detector, that provides an output in response to the detection of a carrier signal which is used to enable or disable the audio output device 190.

Figure 2:
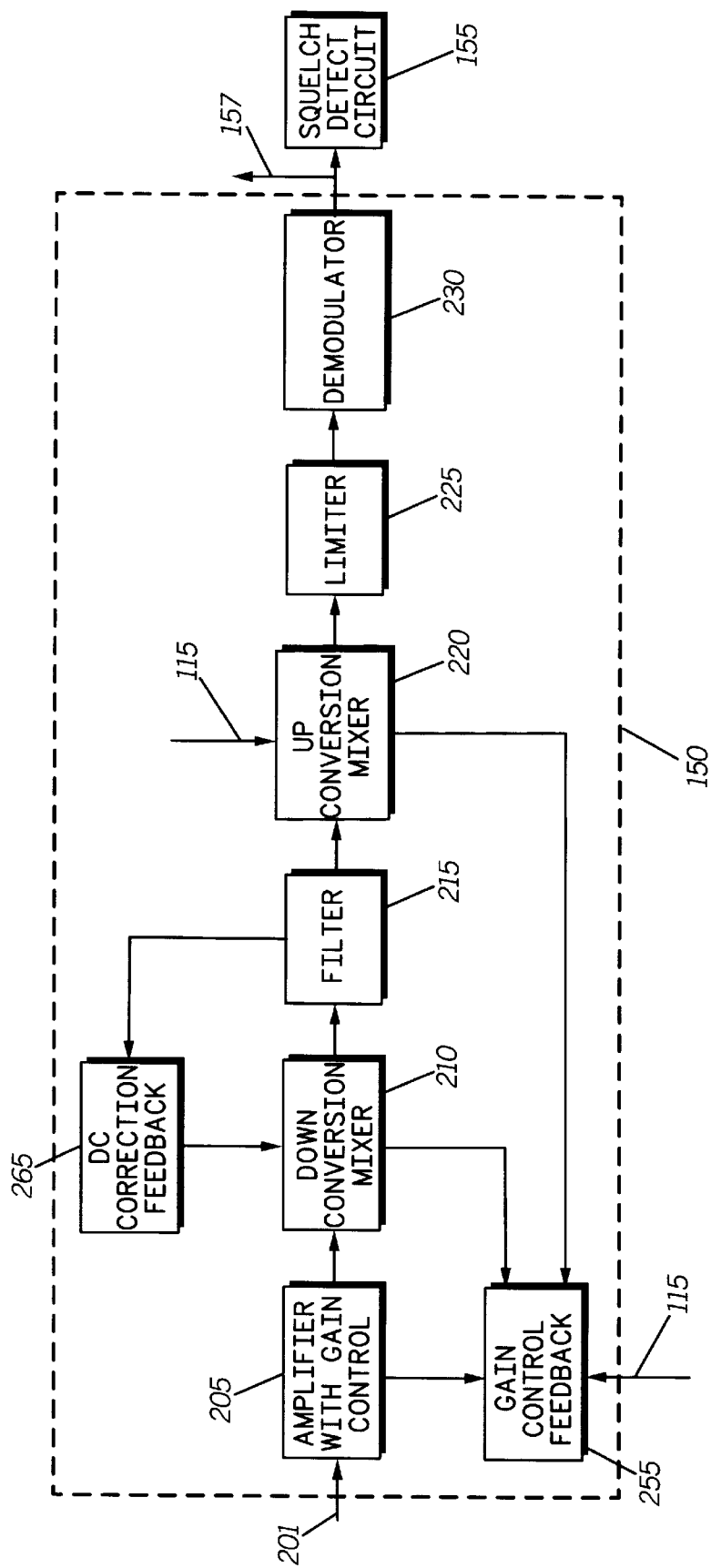
FIG. 2 is a block diagram showing portions of a radio receiver, in accordance with the present invention.

FIG. 2 is a block diagram highlighting significant aspects of the receiver 150, in accordance with the present invention. The receiver 150 is preferably a direct conversion receiver. A received signal 201 is coupled to an amplifier 205 having a controllable gain. The amplifier 205 is coupled to a down conversion mixer 210, which provides input to a filter 215. A direct current (DC) correction feedback loop 265 is established from the output of the filter 215 to the bias of the down conversion mixer 210. An output from the filter 215 is coupled to an up conversion mixer 220. A gain control feedback 255 is coupled to the up conversion mixer 220 and to the down conversion mixer 210 to provide a gain control signal to the amplifier 205. An output from the up conversion mixer 220 is coupled to a limiter 225, and an output from the limiter 225 is coupled to a demodulator 230. The demodulator provides a received signal for processing by the squelch detect circuit 155.

The receiver 150 has first and second operating modes that are mutually exclusive. The second operating mode has particular receiver parameters selected to reduce carrier detect falsing when compared to the first operating mode. The first operating mode is referred to herein as a normal operating mode in that the receiver primarily operates in the first operating mode, when compared to the second operating mode, to process signals received via the antenna. While in the first operating mode, the receiver is programmed, via control signal 115, with parameters selected to properly process a major portion of the received signals. The receiver is programmable to temporarily operate in the second operating mode in response to the detection of a carrier signal while the receiver is in the first operating mode. In the second operating mode, the receiver is programmed with receiver parameters which have an effect on attack time and filter characteristics of the circuitry. These receiver parameters are selected to reduce the probability of carrier detect falsing when compared to the first operating mode. These parameters are selected to reduce attack time, and settling time for the receiver, thereby adjusting the frequency and time response characteristics of the receiver to enable the second operating mode. Preferably, to adjust the frequency and time response characteristics, changes are made to the input impedance of the up conversion mixer, and to the bias current setting of the gain control feedback loop 255 to increase gain. The second operating mode is referred to herein as a carrier squelch adapt mode.

Figure 3:
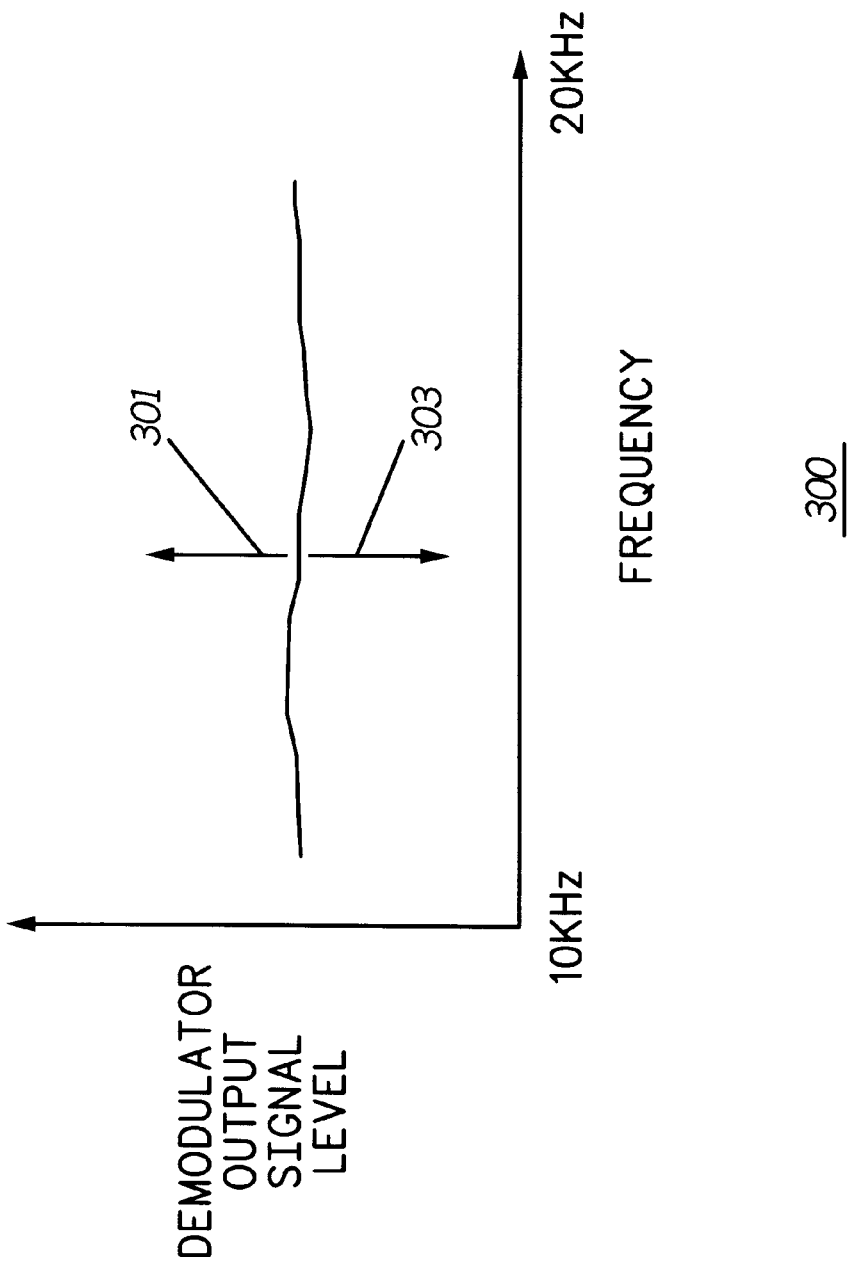
FIG. 3 is a graph showing noise threshold characteristics for triggering a carrier detect signal, in accordance with the present invention.

FIG. 3 shows a graph 300 of an expected voltage level threshold that is used to detect the presence of a carrier signal within a demodulated received signal, in accordance with the present invention. When the demodulated signal has a voltage level within a region 301 above the threshold, it is indicative that an on-channel carrier signal is not present within the demodulated signal. When the demodulated signal has a voltage level within a region 303 below the threshold, it is indicative that an on-channel carrier signal is present within the demodulated signal. Using this information, the squelch detect circuit is programmed with a threshold value such that a carrier detect signal is triggered whenever the demodulated output signal is within the region 303 below the threshold. Preferably, this programmed threshold value is modified when the receiver operates in carrier squelch adapt mode. A carrier detect signal from the squelch detect circuit is used to enable or disable the audio output device.

Figure 4:
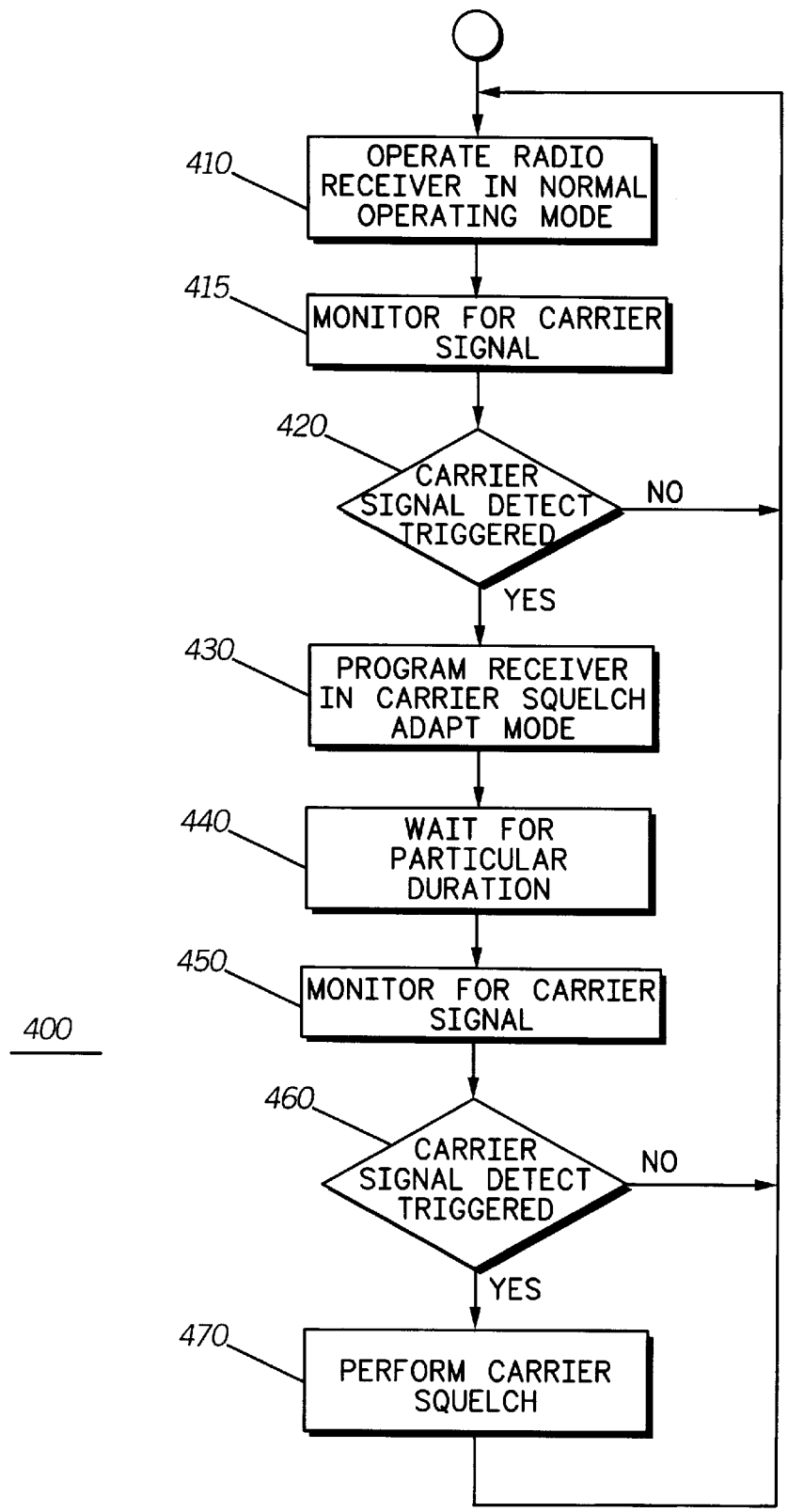
FIG. 4 is a flowchart summarizing procedures used for carrier squelch detect, in accordance with the present invention.

FIG. 4 shows a flowchart 400 summarizing an algorithm used to perform carrier squelch in a receiver, in accordance with the present invention. The receiver operates in a normal operating mode to process signals received via the antenna, step 410. A squelch detect circuit processes a received signal to determine whether to trigger a carrier detect signal according to a particular carrier detect threshold, step 415. When a carrier detect signal is triggered while the receiver is operating in the normal mode, the receiver is programmed to operate in the carrier squelch adapt mode, steps 420, 430. The receiver operates in the carrier squelch adapt mode for a particular duration, step 440, after which the squelch detect circuit processes the received to detect a carrier signal. A second carrier signal detect signal is triggered if a carrier signal is detected while in the carrier squelch adapt mode, step 450. Preferably, multiple sampling of the received signal occurs such that the second carrier signal is triggered when a carrier signal is detected in between multiple successive delay periods. Carrier squelch is performed in response to the second carrier detect signal, i.e., when a carrier detect signal is triggered while in the adapt mode, steps 450, 460 470. In the preferred embodiment, carrier squelch is performed by unmuting the audio output device.

The receiver is reprogrammed to operate in the normal operating mode after temporary operation in the carrier squelch adapt mode.

The present invention provides significant advantages over the prior art. By configuring the receiver to alter frequency and time response characteristics, such as to reduce attack time and settling time, the receiver provides a received signal to the carrier squelch detect that reduces the likelihood of carrier detect falsing. Preferably, the carrier signal detect threshold is also modified to reflect the receiver configuration. In the normal operating mode, the receiver has parameters optimized for processing and presenting received signals destined for the user, and operates in the carrier squelch adapt mode only temporarily. Thus, carrier squelch detection is enhanced through receiver reconfiguration without impacting standard receiver operations. The present invention provides for effective carrier squelch detect in a direct conversion receiver radio.

What is claimed is:

1. A method for performing carrier squelch in a receiver, comprising the steps of:

operating the receiver in a first operating mode to process signals received via an antenna and to generate a received signal therefrom;

triggering a first carrier detect signal based on the received signal while in the first operating mode;

temporarily operating in a second operating mode, in response to the first carrier detect signal, including the steps of:

programming the receiver with parameters selected to alter generation of the received signal in order to reduce carrier detect falsing;

processing the received signal to determine whether a carrier signal is present;

triggering a second carrier detect signal when a carrier signal is present while operating in the second operating mode; and performing carrier squelch in response to the second carrier detect signal being triggered wherein no carrier squelch is performed based on the first carrier detect being triggered without the second carrier detect being also triggered.

2. The method of claim 1, further comprising the step of reprogramming the receiver to operate in the first operating mode after the step of processing the received signal.

3. The method of claim 1, wherein the step of programming the receiver comprises the step of adjusting receiver parameters to change frequency and time response characteristics.

4. The method of claim 1, wherein the received signal is coupled to an audio output device, and the step of performing carrier squelch comprises the step of unmuting the audio output device.

5. A method for performing carrier squelch in a receiver operable to process signals received via an antenna, comprising the steps of:

operating the receiver in a normal operating mode defined as a mode in which the receiver has parameters selected to process a major portion of received signals;

determining whether a first carrier signal detect is triggered while the receiver is in the normal operating mode;

when the first carrier signal detect is triggered:

temporarily operating the receiver in an adapt mode wherein settling time of the receiver is reduced;

determining whether a second carrier signal detect is triggered, while in adapt mode; and performing carrier squelch when the second carrier signal detect is triggered.

6. The method of claim 5, further comprising the steps of:

triggering the first carrier signal detect according to a first signal to noise ratio threshold; and triggering the second carrier signal detect according to a second signal to noise ratio threshold different from the first signal to noise ratio threshold.

7. The method of claim 5, further comprising the step of reprogramming the receiver to operate in the normal operating mode after the step of temporarily operating the receiver in an adapt mode.

8. The method of claim 5, wherein the step determining whether a second carrier signal detect is triggered comprises the steps of:

delaying for a first delay period after the receiver is in the adapt mode; and processing the received signal to detect a carrier signal after expiration of the first delay period.

9. The method of claim 5, wherein the step determining whether a second carrier signal detect is triggered comprises the step of determining that the second carrier signal detect is triggered when a carrier signal is detected in between a plurality of successive delay periods.

10. A radio, comprising:

a receiver that generates a received signal, the receiver having first and second operating modes that are mutually exclusive, the second operating mode having particular receiver parameters selected to alter generation of the received signal in order to reduce carrier detect falsing when compared to the first operating mode;

a carrier signal detector coupled to the receiver and responsive to the received signal to detect a carrier signal;

an output device coupled to the receiver, and having a selectively enabled output that is based on the received signal;

wherein:

the receiver primarily operates in the first operating mode, when compared to the second operating mode, and temporarily operates in the second operating mode when the carrier signal detector detects a carrier signal while the receiver is in the first operating mode; and the output of the output device is enabled when the carrier signal detector detects a carrier signal while the receiver is in the second operating mode.

11. The radio of claim 10, wherein the particular receiver parameters are selected to reduce attack time for the receiver.

12. The radio of claim 10, wherein the particular receiver parameters are selected to reduce settling time for the receiver.

13. The radio of claim 10, wherein the carrier signal detector has a signal to noise ratio threshold that varies based on whether the receiver is in the first operating mode or in the second operating mode.

14. The radio of claim 10, wherein the output device comprises an audio output device that is muted while the receiver is in the first operating mode, and that is unmuted when the carrier signal detector detects a carrier signal while the receiver is in the second operating mode.

15. The radio of claim 10, wherein the receiver is a direct conversion receiver.

* * * * *